(12) United States Patent
Yamamoto et al.

(10) Patent No.: US 11,634,614 B2
(45) Date of Patent: Apr. 25, 2023

(54) METHOD FOR MANUFACTURING SEMICONDUCTOR DEVICE, HEAT-CURABLE RESIN COMPOSITION, AND DICING-DIE ATTACH FILM

(71) Applicant: Resonac Corporation, Tokyo (JP)

(72) Inventors: Kazuhiro Yamamoto, Tokyo (JP); Yui Kunito, Tokyo (JP); Shunsuke Fujio, Tokyo (JP)

(*) Notice: Subject to any disclaimer, the term of this patent is extended or adjusted under 35 U.S.C. 154(b) by 83 days.

(21) Appl. No.: 17/258,747

(22) PCT Filed: Jul. 10, 2019

(86) PCT No.: PCT/JP2019/027416
§ 371 (c)(1),
(2) Date: Jan. 8, 2021

(87) PCT Pub. No.: WO2020/013250
PCT Pub. Date: Jan. 16, 2020

(65) Prior Publication Data
US 2021/0269679 A1    Sep. 2, 2021

(30) Foreign Application Priority Data

Jul. 11, 2018  (JP) .............................. JP2018-131431

(51) Int. Cl.
*H01L 21/683*   (2006.01)
*H01L 25/065*   (2006.01)
(Continued)

(52) U.S. Cl.
CPC ............... *C09J 7/35* (2018.01); *C09J 7/403* (2018.01); *C09J 11/04* (2013.01);
(Continued)

(58) Field of Classification Search
CPC . H01L 21/6836; H01L 25/0657; H01L 21/78; C09J 7/35
See application file for complete search history.

(56) References Cited

U.S. PATENT DOCUMENTS 4,751,107 A *  6/1988  Reiter .................. C09D 177/00
                                                427/178
2017/0253700 A1* 9/2017  Dogen .................... H01L 23/31

FOREIGN PATENT DOCUMENTS

| JP | 2011-046963 | 3/2011 |
| JP | 2012-164890 | 8/2012 |

(Continued)

OTHER PUBLICATIONS

International Preliminary Report on Patentability with Written Opinion dated Jan. 21, 2021 for PCT/JP2019/027416.

(Continued)

*Primary Examiner* — Dale E Page
*Assistant Examiner* — Wilner Jean Baptiste
(74) *Attorney, Agent, or Firm* — Soei Patent & Law Firm

(57) ABSTRACT

A method for manufacturing a semiconductor device according to an aspect of the present disclosure includes a step of preparing a dicing/die-bonding integrated film including an adhesive layer formed of a heat-curable resin composition having a melt viscosity of 3100 Pa·s or higher at 120° C., a tacky adhesive layer, and a base material film; a step of sticking a surface on the adhesive layer side of the dicing/die-bonding integrated film and a semiconductor wafer together; a step of dicing the semiconductor wafer; a step of expanding the base material film and thereby obtaining adhesive-attached semiconductor elements; a step of picking up the adhesive-attached semiconductor element from the tacky adhesive layer; a step of laminating this semiconductor element to another semiconductor element, with the (Continued)

adhesive interposed therebetween; and a step of heat-curing the adhesive.

16 Claims, 7 Drawing Sheets

(51) Int. Cl.
| | | |
|---|---|---|
| *C09J 7/35* | (2018.01) | |
| *C09J 7/40* | (2018.01) | |
| *C09J 11/04* | (2006.01) | |
| *H01L 21/78* | (2006.01) | |
| *H01L 23/00* | (2006.01) | |
| *H01L 25/00* | (2006.01) | |

(52) U.S. Cl.
CPC .......... *H01L 21/6836* (2013.01); *H01L 21/78* (2013.01); *H01L 24/83* (2013.01); *H01L 25/0657* (2013.01); *H01L 25/50* (2013.01); *C09J 2203/326* (2013.01); *C09J 2301/304* (2020.08); *C09J 2433/00* (2013.01); *C09J 2461/00* (2013.01); *C09J 2463/00* (2013.01); *C09J 2467/006* (2013.01); *H01L 2224/83862* (2013.01); *H01L 2225/0651* (2013.01); *H01L 2225/06562* (2013.01)

(56) References Cited

FOREIGN PATENT DOCUMENTS

| | | |
|---|---|---|
| JP | 2013-010849 | 1/2013 |
| JP | 2014-053538 | 3/2014 |
| JP | 2016-190964 | 11/2016 |
| WO | 2005/103180 | 11/2005 |

OTHER PUBLICATIONS

International Search Report dated Sep. 24, 2019 for PCT/JP2019/027416.

* cited by examiner (a)

(b)

METHOD FOR MANUFACTURING SEMICONDUCTOR DEVICE, HEAT-CURABLE RESIN COMPOSITION, AND DICING-DIE ATTACH FILM

CROSS-REFERENCE TO RELATED APPLICATION

This application is a 35 U.S.C. § 371 national phase application of PCT/JP2019/027416, filed on Jul. 10, 2019, which claims priority to Japanese Patent Application No. 2018-131431, filed on Jul. 11, 2018.

TECHNICAL FIELD

The present disclosure relates to a method for manufacturing a semiconductor device, a heat-curable resin composition, and a dicing/die-bonding integrated film.

BACKGROUND ART

Semiconductor devices are manufactured by performing the following steps. First, a semiconductor wafer is fixed with a tacky adhesive sheet for dicing, and the semiconductor wafer in that state is divided into individual semiconductor chips. After that, an expanding step, a pickup step, a die bonding step, a reflow step, a die bonding step, and the like are carried out.

One of the important characteristics required for semiconductor devices is connection reliability. In order to enhance connection reliability, film-shaped adhesives for die bonding have been developed in consideration of heat resistance, moisture resistance, reflow resistance, and the like. For example, Patent Literature 1 discloses an adhesive sheet containing a resin, which includes a high molecular weight component and a heat-curable component including an epoxy resin as a main component, and a filler.

CITATION LIST

Patent Literature

Patent Literature 1: Japanese Unexamined Patent Publication No. 2016-190964

SUMMARY OF INVENTION

Technical Problem

The inventors of the present disclosure are proceeding with the development of a heat-curable adhesive to be used in a manufacturing process for a semiconductor device provided with increased capacity (for example, three-dimensional NAND memory) by laminating semiconductor elements in multiple stages. Since a wafer for three-dimensional NAND is composed of a complicated circuit layer and a relatively thin semiconductor layer (for example, about 15 to 25 μm), there is a problem that semiconductor elements obtained by dividing this wafer into individual chips are prone to have warpage.

FIG. 5(a) is a cross-sectional view schematically illustrating a structure for a process for manufacturing a semiconductor device. The structure 30 illustrated in FIG. 5(a) comprises a substrate 10 and four semiconductor elements S1, S2, S3, and S4 laminated on the substrate. The four semiconductor elements S1, S2, S3, and S4 are laminated at positions shifted from each other in the transverse direction (direction orthogonally intersecting the direction of lamination) for the connection to the electrodes (not illustrated in the diagram) formed on the surface of the substrate 10 (see FIG. 1). The semiconductor element S1 is adhered to the substrate 10 by means of an adhesive, and an adhesive is also interposed between the three semiconductor elements S2, S3, and S4.

According to the investigation of the inventors of the present disclosure, in a case in which the semiconductor elements S1, S2, S3, and S4 each have a complicated circuit layer (upper surface side) and a relatively thin semiconductor layer (lower surface side), as illustrated in FIG. 5(b), detachment is liable to occur between the semiconductor element S1 of the first stage and the semiconductor element S2 of the second stage. The present inventors infer the cause for this as follows.

Due to the complicated circuit layer and the thin semiconductor layer, the semiconductor elements S1, S2, S3, and S4 have a property of being easily warped (warping stress) as described above.

An overhang portion H is formed by laminating a plurality of semiconductor elements at positions shifted in the transverse direction.

Since it has been confirmed that detachment does not occur in the stage where the semiconductor element S2 of the second stage is mounted, when the semiconductor elements S3 and S4 of the third stage and the fourth stage are mounted, an upward force (warping stress in the direction of causing detachment from the semiconductor element S1 of the first stage) increases in the hangover portion H of the semiconductor element S2 of the second stage.

The present disclosure was achieved in view of the above-described problems, and the present disclosure provides a method for manufacturing a semiconductor device in which a plurality of semiconductor elements are laminated and in which detachment between adjacent semiconductor elements is not likely to occur. Furthermore, the present disclosure provides a heat-curable resin composition and a dicing/die-bonding integrated film, which can be applied to this manufacturing method.

Solution to Problem

According to an aspect of the present disclosure, there is provided a method for manufacturing a semiconductor device (for example, three-dimensional NAND memory) in which a plurality of semiconductor elements are laminated. This manufacturing method includes: a step of preparing a dicing/die-bonding integrated film including an adhesive layer formed of a heat-curable resin composition having a melt viscosity of 3100 Pa·s or higher at 120° C., a tacky adhesive layer, and a base material film in this order; a step of sticking a surface on the adhesive layer side of the dicing/die-bonding integrated film and a semiconductor wafer together; a step of dicing the semiconductor wafer; a step of expanding the base material film and thereby dividing the semiconductor wafer and the adhesive layer into individual pieces, to obtain an adhesive-attached semiconductor element formed of the individual piece; a step of picking up the adhesive-attached semiconductor element from the tacky adhesive layer; a step of laminating the adhesive-attached semiconductor element to another semiconductor element, with the adhesive of the adhesive-attached semiconductor element interposed therebetween; and a step of heat-curing the film-shaped adhesive.

When a heat-curable resin composition having a melt viscosity of 3100 Pa·s or higher at 120° C. is employed, even if the semiconductor element to be adhered has relatively strong warping stress, an interfacial adhesive force that can withstand this warping stress can be achieved. Thereby, even if a plurality of semiconductor elements are laminated, detachment between adjacent semiconductor elements can be sufficiently suppressed.

As in the case of a semiconductor wafer for three-dimensional NAND, in order to divide a relatively thin semiconductor wafer into individual semiconductor elements, it is preferable that the semiconductor wafer is subjected to stealth dicing or blade dicing, and then the base material film is expanded under cooling conditions (for example, −15° C. to 0° C.), from the viewpoint of high product yield or the like.

According to an aspect of the present disclosure, there is provided a heat-curable resin composition to be used for a production process for a semiconductor device, the heat-curable resin composition having a melt viscosity of 3100 Pa·s or higher at 120° C. This heat-curable resin composition can be applied to the above-described method for manufacturing a semiconductor device.

The heat-curable resin composition contains a heat-curable resin, a high-molecular weight component having a molecular weight of 100000 to 1000000 (for example, an acrylic resin), and a filler, and it is preferable that the content of the high-molecular weight component based on the total mass of the heat-curable resin composition is 15% to 50% by mass, while it is preferable that the content of the filler is 25% to 45% by mass. By adjusting the contents of the high-molecular weight component and the filler to the above-described ranges, an adhesive-attached semiconductor element can be produced more efficiently and stably by subjecting a semiconductor wafer to stealth dicing or blade dicing and subsequently performing expansion and pickup under cooling conditions.

The present disclosure provides a dicing/die-bonding integrated film comprising a tacky adhesive layer and an adhesive layer formed of the above-described heat-curable resin composition. This integrated film can be applied to the above-described method for manufacturing a semiconductor device. The thickness of the adhesive layer is, for example, 3 to 40 μm from the viewpoints of cost and adhesive strength.

Advantageous Effects of Invention

According to the present disclosure, there is provided a method for manufacturing a semiconductor device in which a plurality of semiconductor elements are laminated and in which detachment between adjacent semiconductor elements is not likely to occur. Furthermore, according to the present disclosure, a heat-curable resin composition and a dicing/die-bonding integrated film, which can be applied to the above-described manufacturing method, are provided.

DESCRIPTION OF EMBODIMENTS

Figure 1:
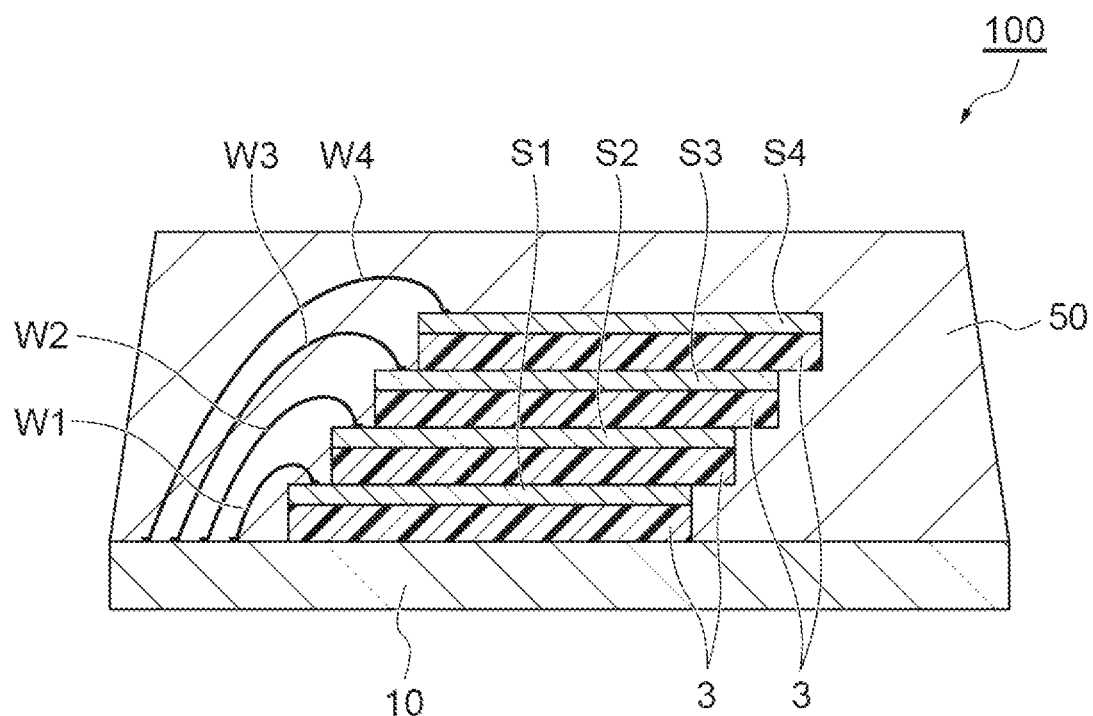
FIG. 1 is a cross-sectional view schematically illustrating an example of a semiconductor device.

Hereinafter, embodiments of the present disclosure will be described in detail with reference to the drawings. In the following description, identical reference numerals will be assigned to identical or equivalent parts, and any overlapping descriptions will not be repeated here. Furthermore, unless particularly stated otherwise, the positional relationship such as top, bottom, right, and left are based on the positional relationships illustrated in the drawings. In addition, the dimensional ratio of a drawing is not limited to the ratio illustrated in the diagram. Incidentally, the description "(meth)acryl" in the present specification means "acryl" and "methacryl" corresponding thereto.

<Semiconductor Device>

FIG. 1 is a cross-sectional view schematically illustrating a semiconductor device according to the present embodiment. A semiconductor device 100 illustrated in this diagram comprises a substrate 10; four semiconductor elements S1, S2, S3, and S4 laminated on the surface of the substrate 10; wires W1, W2, W3, and W4 electrically connecting electrodes (not illustrated in the diagram) on the surface of the substrate 10 and the four semiconductor elements S1, S2, S3, and S4; and a sealing layer 50 for sealing these.

The substrate 10 is, for example, an organic substrate and may be a metal substrate such as a lead frame. Regarding the substrate 10, from the viewpoint of suppressing warpage of the semiconductor device 100, the thickness of the substrate 10 is, for example, 90 to 180 μm, and may be 90 to 140 μm.

The four semiconductor elements S1, S2, S3, and S4 are laminated with a cured product 3 of a film-shaped adhesive 3P (see FIG. 2) interposed therebetween. The shape of the semiconductor elements S1, S2, S3, and S4 as viewed in plan view is, for example, a rectangular shape (square or rectangle). The length of one side of the semiconductor elements S1, S2, S3, and S4 is, for example, 5 mm or less, and may be 2 to 4 mm or 1 to 4 mm. The thickness of the semiconductor elements S1, S2, S3, and S4 is, for example, 10 to 170 μm, and may be 10 to 30 μm. The lengths of one side of the four semiconductor elements S1, S2, S3, and S4 may be the same or different from each other, and the same also applies to the thickness.

<Adhesive-Attached Semiconductor Element>

Figure 2:
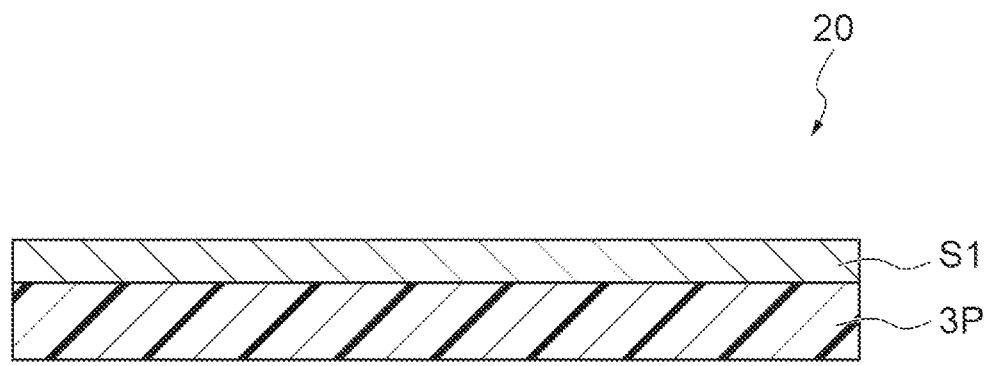
FIG. 2 is a cross-sectional view schematically illustrating an example of an adhesive-attached semiconductor element composed of a film-shaped adhesive and a semiconductor element.

FIG. 2 is a cross-sectional view schematically illustrating an example of an adhesive-attached semiconductor element. An adhesive-attached semiconductor element 20 illustrated in FIG. 2 is composed of a film-shaped adhesive 3P and a semiconductor element S1. As illustrated in FIG. 2, the film-shaped adhesive 3P and the semiconductor element S1 have substantially the same size. This also applies to the film-shaped adhesive 3P and the semiconductor elements S2 S3, and S4. The adhesive-attached semiconductor element 20 is produced by performing a dicing step and a pickup step, as will be described next.

With reference to FIG. 3(a) to FIG. 3(f), an example of the method for producing the adhesive-attached semiconductor element 20 (laminate of a film-shaped adhesive 3P and a semiconductor element S1) as illustrated in FIG. 2 will be described. First, a dicing/die-bonding integrated film 8 (hereinafter, referred to as "film 8" depending on cases) is prepared, and this is disposed in a predetermined device (not illustrated in the diagram). The film 8 comprises a base material film 1; a tacky adhesive layer 2; and an adhesive layer 3A in this order. The base material film 1 is, for example, a polyethylene terephthalate film (PET film). A semiconductor wafer W is, for example, a thin semiconductor wafer having a thickness of 10 to 100 μm. The semiconductor wafer W may be single crystal silicon or may be a compound semiconductor such as polycrystalline silicon, various ceramics, or gallium arsenide.

The adhesive layer 3A is formed of a heat-curable resin composition as will be described below. From the viewpoints of cost and the adhesive strength of the cured product, the thickness of the adhesive layer 3A is, for example, 3 to 40 μm, and may be 3 to 30 μm or 3 to 25 μm.

Figure 3:
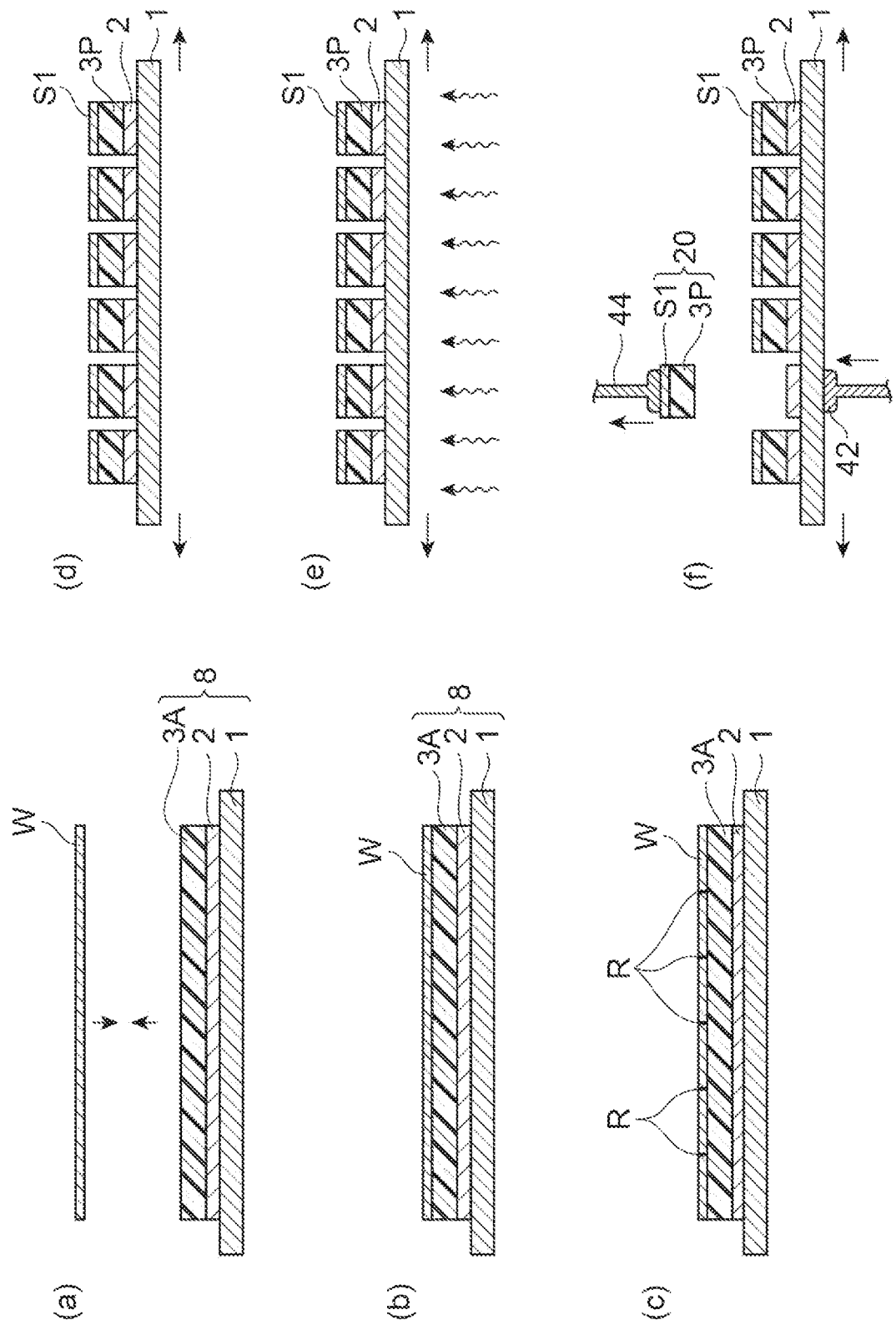
FIG. 3(a) to FIG. 3(f) are cross-sectional views schematically illustrating a process for manufacturing an adhesive-attached semiconductor element.

As illustrated in FIG. 3(a) and FIG. 3(b), the film 8 is stuck to one surface of the semiconductor wafer W such that the adhesive layer 3A comes into contact with the surface. This step is carried out under the temperature conditions of preferably 50° C. to 100° C., and more preferably 60° C. to 80° C. When the temperature is 50° C. or higher, satisfactory adhesiveness between the semiconductor wafer W and the adhesive layer 3A can be obtained, and when the temperature is 100° C. or lower, excessive flow of the adhesive layer 3A in this step is suppressed.

By irradiating the semiconductor wafer W with laser light along intended cutting lines, modified regions R are formed in the semiconductor wafer W (stealth dicing) as illustrated in FIG. 3(c). Instead of stealth dicing, cutting lines may be inserted into the semiconductor wafer also by blade dicing. Incidentally, the semiconductor wafer W may be thinned by grinding the semiconductor wafer W prior to irradiation of the semiconductor wafer W with laser light or blade dicing.

As illustrated in FIG. 3(d), the semiconductor wafer W is divided at the modified regions R by expanding the base material film 1 at normal temperature or under cooling conditions. Thereby, the semiconductor wafer W is divided into a large number of individual semiconductor elements S1, and at the same time, the adhesive layer 3A is divided into individual pieces of the film-shaped adhesive 3P. In a case in which the tacky adhesive layer 2 is, for example, UV-curable, the tacky adhesive layer 2 is cured by irradiating the tacky adhesive layer 2 with ultraviolet radiation in a state in which the adhesive-attached semiconductor elements 20 are separated apart from one another by expansion as illustrated in FIG. 3(e), and the tacky adhesive force between the tacky adhesive layer 2 and the adhesive layer 3A is decreased. After the ultraviolet irradiation, the adhesive-attached semiconductor elements 20 are detached from the tacky adhesive layer 2 by pushing up these semiconductor elements with a needle 42, and also, the adhesive-attached semiconductor elements 20 are picked up by suctioning the elements with a suction collet 44 (see FIG. 3(f)). In this way, the adhesive-attached semiconductor elements 20 as illustrated in FIG. 2 are obtained.

From the viewpoint of suitably dividing the adhesive layer 3A and obtaining film-shaped adhesives 3P having a predetermined shape and a predetermined size, it is preferable to perform the expansion of the base material film 1 under cooling conditions. This temperature condition may be, for example, −15° C. to 0° C.

<Method for Manufacturing Semiconductor Device>

Figure 4:
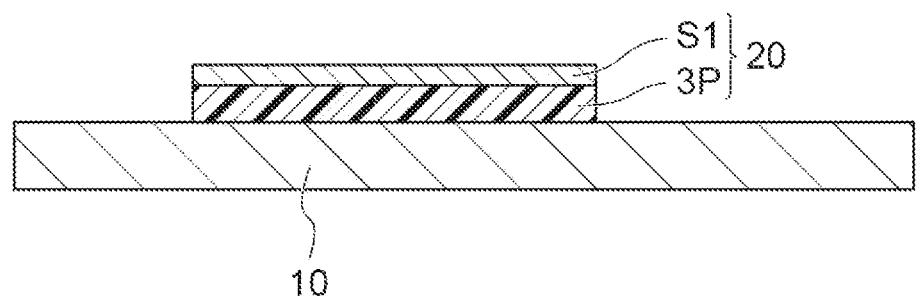
FIG. 4 is a cross-sectional view schematically illustrating a process for manufacturing the semiconductor device illustrated in FIG. 1.
Figure 5:
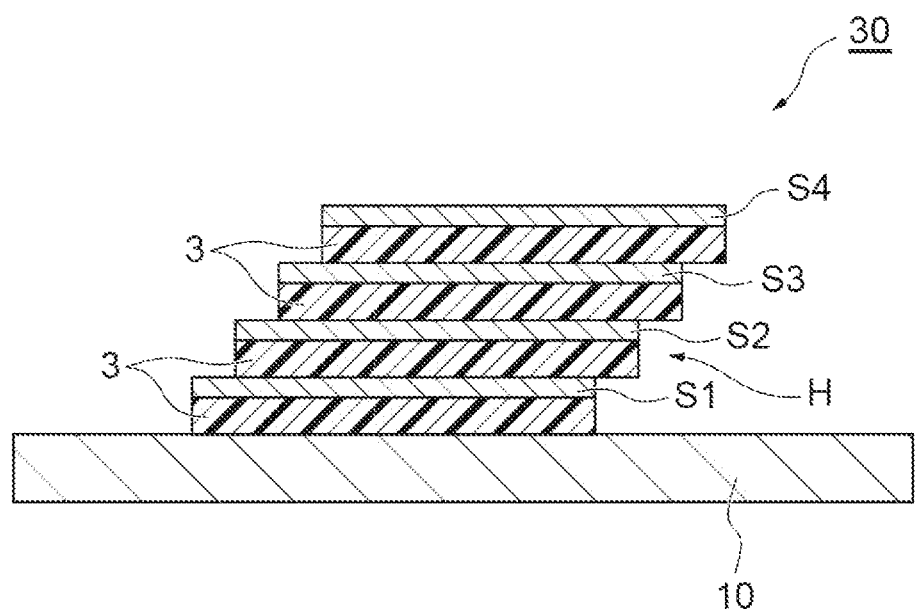
FIG. 5(a) is a cross-sectional view schematically illustrating a process for manufacturing the semiconductor device illustrated in FIG. 1.
FIG. 5(b) is a cross-sectional view illustrating a structure in which detachment is occurring between the semiconductor element of the first stage and the semiconductor element of the second stage.
Figure 5:
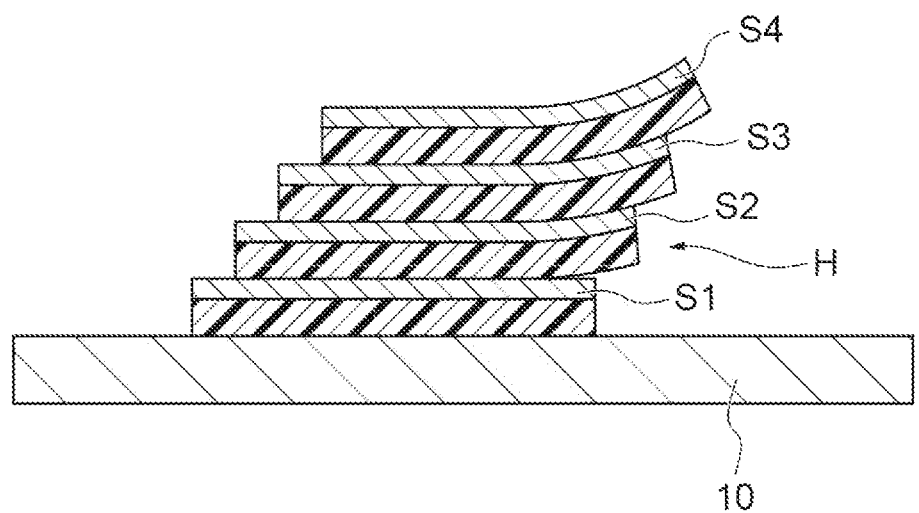
Figure 6:
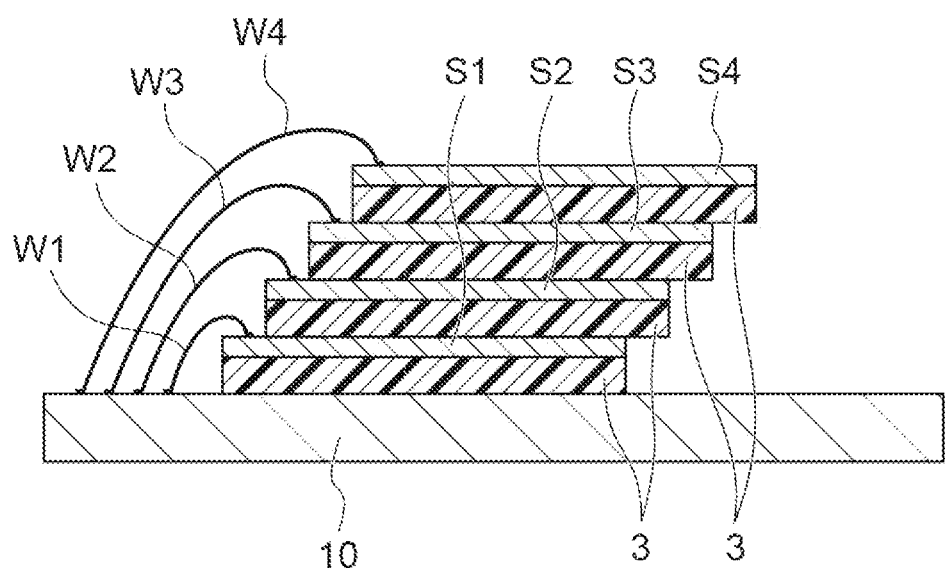
FIG. 6 is a cross-sectional view schematically illustrating a process for manufacturing the semiconductor device illustrated in FIG. 1.

A method for manufacturing the semiconductor device 100 will be described with reference to FIG. 4 to FIG. 6. First, as illustrated in FIG. 4, a semiconductor element S1 of a first stage is pressure-bonded onto the surface of a substrate 10. That is, the semiconductor element S1 is pressure-bonded at a predetermined position of the substrate 10, with the film-shaped adhesive 3P of the adhesive-attached semiconductor element 20 interposed therebetween. It is preferable that this pressure-bonding treatment is carried out, for example, for 0.5 to 3.0 seconds under the conditions of 80° C. to 180° C. and 0.01 to 0.50 MPa. Next, the film-shaped adhesive 3P is cured by heating. It is preferable that this curing treatment is carried out, for example, for 5 minutes or longer under the conditions of 60° C. to 175° C. and 0.01 to 1.0 MPa. Thereby, the film-shaped adhesive 3P is cured to form a cured product 3. The curing treatment of the film-shaped adhesive 3P may be carried out under a pressurized atmosphere, from the viewpoint of reducing voids.

A semiconductor element S2 of a second stage is mounted on the surface of the semiconductor element S1 in the same manner as in the mounting of the semiconductor element S1 on the substrate 10. Furthermore, a structure 30 as illustrated in FIG. 5(a) is produced by mounting semiconductor elements S3 and S4 of a third stage and a fourth stage. The semiconductor elements S1, S2, S3, and S4, and the substrate 10 are electrically connected using wires W1, W2, W3, and W4 (see FIG. 5), subsequently the semiconductor elements and the wires are sealed by a sealing layer 50, and thus, the semiconductor device 100 illustrated in FIG. 1 is completed.

<Heat-Curable Resin Composition>

The heat-curable resin composition constituting the film-shaped adhesive 3P will be described. Incidentally, the film-shaped adhesive 3P is a resultant product of dividing the adhesive layer 3A into individual pieces, and both of them comprise the same heat-curable resin composition. This heat-curable resin composition may go through, for example, a semi-cured (stage B) state and then enter a completely cured product (stage C) state by a subsequent curing treatment.

The heat-curable resin composition has a melt viscosity at 120° C. of 3100 Pa·s or more. By using a heat-curable resin composition, even if the semiconductor element to be adhered has relatively strong warping stress, an interfacial adhesive force that can withstand this warping stress can be achieved. Thereby, even if a plurality of semiconductor elements are laminated, detachment between adjacent semiconductor elements can be sufficiently suppressed. The melt viscosity at 120° C. of the heat-curable resin composition may be 3100 to 40000 Pa·s or may be 5000 to 35000 Pa·s. The lower limit value of this melt viscosity may be 13000 Pa·s or may be 14000 Pa·s. Incidentally, the melt viscosity means a measurement value obtainable by performing measurement while applying 5% strain to the heat-curable resin composition molded into a film shape using ARES (manufactured by TA Instruments, Inc.) and while raising the temperature at a rate of temperature increase of 5° C./min.

The heat-curable resin composition (before curing treatment) has, for example, a storage modulus at 35° C. of 70 MPa or higher. By using such a heat-curable resin composition, even if the semiconductor element to be adhered has relatively strong warping stress, a cohesive force that can withstand this warping stress can be achieved. Thereby, even if a plurality of semiconductor elements are laminated, detachment between adjacent semiconductor elements can be sufficiently suppressed. The storage modulus at 35° C. of the heat-curable resin composition may be 70 to 1000 MPa or may be 80 to 900 MPa. Incidentally, the storage modulus means a value obtainable by performing measurement using the following apparatus and conditions.

Dynamic viscoelasticity measuring apparatus: Rheogel E-4000 (manufactured by UBM)
Object of measurement: Heat-curable resin composition molded into film shape
Rate of temperature increase: 3° C./min
Frequency: 10 Hz It is preferable that the heat-curable resin composition includes the following components.

(a) A heat-curable resin (hereinafter, may be simply referred to as "component (a)")

(b) A high-molecular weight component (hereinafter, may be simply referred to as "component (b)")

(c) A filler (hereinafter, may be simply referred to as "component (c)")

According to the present embodiment, in a case in which the (a) heat-curable resin includes an epoxy resin (hereinafter, may be simply referred to as "component (a1)"), it is preferable that the (a) heat-curable resin includes a phenolic resin (hereinafter, may be simply referred to as "component (a2)") that can serve as a curing agent for an epoxy resin. Incidentally, in a case in which the (b) high-molecular weight component has a functional group that is heat-cured with a phenolic resin (glycidyl group or the like), an epoxy resin may not be separately used as the (a) heat-curable resin.

The heat-curable resin composition may further include the following components.

(d) A coupling agent (hereinafter, may be simply referred to as "component (d)")

(e) A curing accelerator (hereinafter, may be simply referred to as "component (e)")

The content of the component (a) based on the total mass of the heat-curable resin composition is, for example, 30% by mass or less and may be 5% to 30% by mass. The content of the component (b) based on the total mass of the heat-curable resin composition is, for example, 15% to 66% by mass and may be 15% to 50% by mass. The content of the component (c) based on the total mass of the heat-curable resin composition is, for example, 25% to 50% by mass and may be 25% to 45% by mass. By adjusting the contents of the component (b) and the component (c) to the above-described ranges, an adhesive-attached semiconductor element can be produced more efficiently and stably by subjecting a semiconductor wafer to stealth dicing or blade dicing and then expanding and picking up semiconductor elements under cooling conditions.

Specifically, as the content of the component (b) is 66% by mass or less, there is a tendency that excellent divisibility is obtained when expansion is performed under cooling conditions (see FIG. 3(d)). Furthermore, when the content of the component (b) is 15% by mass or more and the content of the component (c) is 50% by mass or less, the bulk strength under cooling conditions is sufficiently high, and the semiconductor wafer is likely to be divided into a predetermined shape and a predetermined size by expansion. Incidentally, in order to adjust the melt viscosity at 120° C. of the heat-curable resin composition to the above-described range, the amounts of the (a) heat-curable resin, the (b) high-molecular weight component, and the (c) filler may be appropriately adjusted.

The storage modulus at 150° C. of a cured product (stage C) of the heat-curable resin composition is preferably 10 MPa or higher, and more preferably 25 MPa or higher, from the viewpoint of connection reliability, and the storage modulus may also be 50 MPa or higher or 100 MPa or higher. Incidentally, the upper limit value of the storage modulus is, for example, 600 MPa and may be 500 MPa. The storage modulus at 150° C. of a cured product of the heat-curable resin composition can be measured using a product obtained by curing the heat-curable resin composition under the temperature conditions of 175° C. as a sample and using a dynamic viscoelasticity apparatus.

Hereinafter, the various components included in the heat-curable resin composition will be described.

(a) Heat-Curable Resin

Regarding the component (a1), any compound having an epoxy group in the molecule can be used without particular limitation.

Examples of the component (a1) include a bisphenol A type epoxy resin, a bisphenol F type epoxy resin, a bisphenol S type epoxy resin, a phenol novolac type epoxy resin, a cresol novolac type epoxy resin, a bisphenol A novolac type epoxy resin, a bisphenol F novolac type epoxy resin, a dicyclopentadiene skeleton-containing epoxy resin, a stilbene type epoxy resin, a triazine skeleton-containing epoxy resin, a fluorene skeleton-containing epoxy resin, a triphenolphenolmethane type epoxy resin, a biphenyl type epoxy resin, a xylylene type epoxy resin, a biphenylaralkyl type epoxy resin, a naphthalene type epoxy resin, a polyfunctional phenol, and a diglycidyl ether compound of a polycyclic aromatic compound such as anthracene. These may be used singly or in combination of two or more kinds thereof. Among these, the component (a1) may be a cresol novolac type epoxy resin, a bisphenol F type epoxy resin, or a bisphenol A type epoxy resin, from the viewpoint of heat resistance.

The epoxy equivalent of the component (a1) may be 90 to 300 g/eq, 110 to 290 g/eq, or 130 to 280 g/eq. When the epoxy equivalent of the component (a1) is in such a range, there is a tendency that fluidity can be secured while the bulk strength of the film-shaped adhesive is maintained.

The content of the component (a1) may be 50 parts by mass or less, 5 to 50 parts by mass, 10 to 40 parts by mass, or 20 to 30 parts by mass, with respect to 100 parts by mass of the total mass of the component (a), component (b), and component (c). When the content of the component (a1) is 5 parts by mass or more, the embeddability of the film-shaped adhesive tends to become more satisfactory. When the content of the component (a1) is 50 parts by mass or less, there is a tendency that the occurrence of bleeding can be further suppressed.

Regarding the component (a2), any component having a phenolic hydroxyl group in the molecule can be used without particular limitation. Examples of the component (a2) include a novolac type phenolic resin obtainable by condensing or co-condensing a phenol such as phenol, cresol, resorcin, catechol, bisphenol A, bisphenol F, phenylphenol, or aminophenol, and/or a naphthol such as α-naphthol, β-naphthol, or dihydroxynaphthalene, and a compound having an aldehyde group such as formaldehyde in the presence of an acidic catalyst; a phenol aralkyl resin synthesized from a phenol such as allylated bisphenol A, allylated bisphenol F, allylated naphthalenediol, phenol novolac, or phenol, and/or a naphthol, and dimethoxyparaxylene or bis(methoxymethyl)biphenyl; and a naphthol aralkyl resin. These may be used singly or in combination of two or more kinds thereof. Among these, the component (a2) may be a phenol aralkyl resin, a naphthol aralkyl resin, or a novolac type phenol resin, from the viewpoints of moisture absorption property and heat resistance.

The hydroxyl group equivalent of the component (a2) may be 80 to 250 g/eq, 90 to 200 g/eq, or 100 to 180 g/eq. When the hydroxyl group equivalent of the component (a2) is in such a range, there is a tendency that the adhesive force can be maintained higher while maintaining the fluidity of the film-shaped adhesive.

The softening point of the component (a2) may be 50° C. to 140° C., 55° C. to 120° C., or 60° C. to 100° C.

The content of the component (a2) may be 5 to 50 parts by mass, 10 to 40 parts by mass, or 20 to 30 parts by mass, with respect to 100 parts by mass of the total mass of the component (a), component (b), and component (c). When the content of the component (a2) is 5 parts by mass or more, more satisfactory curability tends to be obtained. When the content of the component (a2) is 50 parts by mass or less, the embeddability of the film-shaped adhesive tends to become more satisfactory.

The ratio of the epoxy equivalent of the component (a1) and the hydroxyl group equivalent of the component (a2) (epoxy equivalent of component (a1)/hydroxyl group equivalent of component (a2)) may be 0.30/0.70 to 0.70/0.30, 0.35/0.65 to 0.65/0.35, 0.40/0.60 to 0.60/0.40, or 0.45/0.55 to 0.55/0.45, from the viewpoint of curability. When this equivalent ratio is 0.30/0.70 or higher, more sufficient curability tends to be obtained. When this equivalent ratio is 0.70/0.30 or lower, excessive increase of viscosity can be prevented, and more sufficient fluidity can be obtained.

(b) High-Molecular Weight Component

It is preferable that the component (b) has a glass transition temperature (Tg) of 50° C. or lower. Examples of the component (b) include an acrylic resin, a polyester resin, a polyamide resin, a polyimide resin, a silicone resin, a butadiene resin, an acrylonitrile resin, and modification products of these.

The component (b) may include an acrylic resin from the viewpoint of fluidity. Here, the acrylic resin means a polymer including a constituent unit derived from a (meth) acrylic acid ester. It is preferable that the acrylic resin is a polymer including a constituent unit derived from a (meth) acrylic acid ester having a crosslinkable functional group such as an epoxy group, an alcoholic or phenolic hydroxyl group, or a carboxyl group, as a constituent unit. Furthermore, the acrylic resin may be an acrylic rubber such as a copolymer of a (meth)acrylic acid ester and acrylonitrile.

The glass transition temperature (Tg) of the acrylic resin may be −50° C. to 50° C. or −30° C. to 30° C. When the Tg of the acrylic resin is −50° C. or higher, there is a tendency that excessive increase of the pliability of the adhesive composition can be prevented. Thereby, it becomes easy to cut the film-shaped adhesive at the time of wafer dicing, and the occurrence of burring can be prevented. When the Tg of the acrylic resin is 50° C. or lower, there is a tendency that deterioration of pliability of the adhesive composition can be suppressed. Thereby, when the film-shaped adhesive is stuck to a wafer, voids tend to be sufficiently easily embedded. Furthermore, it is possible to prevent chipping at the time of dicing caused by deterioration of the tight adhesiveness to the wafer. Here, the glass transition temperature (Tg) means a value measured using a DSC (thermal differential scanning calorimeter) (for example, "Thermo Plus 2" manufactured by Rigaku Corp.).

The weight average molecular weight (Mw) of the acrylic resin is, for example, 100000 to 3000000, and may be 100000 to 1000000, 100000 to 800000, or 300000 to 2000000. When the Mw of the acrylic resin is in such a range, the film-forming properties, strength in the film form, flexibility, tackiness, and the like can be appropriately controlled, and at the same time, excellent reflow properties are obtained, and embeddability can be enhanced. Here, the Mw means a value measured by gel permeation chromatography (GPC) and converted using a calibration curve based on polystyrene standards.

Examples of a commercially available product of the acrylic resin include SG-70L, SG-708-6, WS-023 EK30, SG-P3, SG-280 EK23, HTR-860P-3CSP, and HTR-860P-3CSP-3DB (all manufactured by Nagase ChemteX Corp.).

The content of the component (b) may be 5 to 70 parts by mass, 10 to 50 parts by mass, or 15 to 30 parts by mass, with respect to 100 parts by mass of the total mass of the component (a), component (b), and component (c). When the content of the component (b) is 5 parts by mass or more, the control of fluidity at the time of molding and the handleability at high temperatures can be made more satisfactory. When the content of the component (b) is 70 parts by mass or less, the embeddability can be made more satisfactory.

(c) Filler

Examples of the component (c) include, for example, inorganic fillers such as aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whiskers, boron nitride, and silica. These may be used singly or in combination of two or more kinds thereof. Among these, the component (c) may be silica from the viewpoint of compatibility with resins.

The average particle size of the component (c) may be 0.005 to 1 μm or 0.05 to 0.5 μm, from the viewpoint of enhancing adhesiveness. Here, the average particle size means a value that can be determined by converting from the BET specific surface area.

The content of the component (c) may be 5 to 50 parts by mass, 15 to 45 parts by mass, or 25 to 40 parts by mass, with respect to 100 parts by mass of the total mass of the component (a), component (b), and component (c). When the content of the component (c) is 5 parts by mass or more, the fluidity of the film-shaped adhesive tends to be further enhanced. When the content of the component (c) is 50 parts by mass or less, the dicing characteristics of the film-shaped adhesive tend to become more satisfactory.

(d) Coupling Agent

The component (d) may be a silane coupling agent. Examples of the silane coupling agent include γ-ureidopropyltriethoxysilane, γ-mercaptopropyltrimethoxysilane, 3-phenylaminopropyltrimethoxysilane, and 3-(2-aminoethyl)aminopropyltrimethoxysilane. These may be used singly or in combination of two or more kinds thereof.

The content of the component (d) may be 0.01 to 5 parts by mass with respect to 100 parts by mass of the total mass of the component (a), component (b), and component (c).

(e) Curing Accelerator

The component (e) is not particularly limited, and any compound that is generally used can be used. Examples of the component (e) include an imidazole and derivatives thereof, an organophosphorus-based compound, a secondary amine, a tertiary amine, and a quaternary ammonium salt. These may be used singly or in combination of two or more kinds thereof. Among these, from the viewpoint of reactivity, the component (e) may be an imidazole and derivatives thereof.

Examples of the imidazole include 2-methylimidazole, 1-benzyl-2-methylimidazole, 1-cyanoethyl-2-phenylimidazole, and 1-cyanoethyl-2-methylimidazole. These may be used singly or in combination of two or more kinds thereof.

The content of the component (e) may be 0.01 to 1 part by mass with respect to 100 parts by mass of the total mass of the component (a), component (b), and component (c).

<Dicing/Die-Bonding Integrated Film and Method for Manufacturing Same>

The dicing/die-bonding integrated film 8 illustrated in FIG. 3(a) and a method for manufacturing the same will be described. The method for manufacturing the film 8 includes a step of applying a varnish of an adhesive composition containing a solvent on a base material film for adhesive layer (not illustrated in the diagram); and a step of heating and drying the applied varnish at 50° C. to 150° C. and thereby forming an adhesive layer 3A.

The varnish of the adhesive composition can be prepared by, for example, mixing or kneading the components (a) to (c), as well as optionally the component (d) and the component (e) in a solvent. Mixing or kneading can be carried out using a dispersing machine such as conventional stirrer, a Raikai mixer, a three-roll, or a ball mill and by appropriately combining these.

The solvent for producing a varnish is not limited so long as the various components described above can be uniformly dissolved, kneaded, or dispersed, and any conventionally known solvent can be used. Examples of such a solvent include ketone-based solvents such as acetone, methyl ethyl ketone, methyl isobutyl ketone, or cyclohexanone; dimethylformamide, dimethylacetamide, N-methylpyrrolidone, toluene, and xylene. From the viewpoint that the drying rate is fast and the price is low, it is preferable to use methyl ethyl ketone, cyclohexanone, or the like.

The base material film for adhesive layer is not particularly limited, and examples include a polyester film, a polypropylene film (OPP film or the like), a polyethylene terephthalate film, a polyimide film, a polyetherimide film, a polyether naphthalate film, and a methylpentene film.

Regarding the method for applying a varnish on a base material film, any known method can be used, and examples include a knife coating method, a roll coating method, a spray coating method, a gravure coating method, a bar coating method, and a curtain coating method. The conditions for heating and drying are not particularly limited so long as they are conditions in which the used solvent is sufficiently volatilized; however, for example, heating and drying can be carried out by heating at 50° C. to 150° C. for 1 to 30 minutes. Heating and drying may be carried out by raising the temperature stepwise to a temperature in the range of 50° C. to 150° C. By volatilizing the solvent included in the varnish by heating and drying, a laminate film of a base material film and an adhesive layer 20A can be obtained.

The film 8 can be obtained by sticking the laminate film obtained as described above and a dicing film (laminate of a base material film 1 and a tacky adhesive layer 2) together. Examples of the base material film 1 include plastic films such as a polytetrafluoroethylene film, a polyethylene terephthalate film, a polyethylene film, a polypropylene film, a polymethylpentene film, and a polyimide film. Furthermore, the base material film 1 may be subjected to a surface treatment such as primer coating, a UV treatment, a corona discharge treatment, a polishing treatment, or an etching treatment, as necessary. The tacky adhesive layer 2 may be a UV-curable type or may be a pressure-sensitive type. The film 8 may further comprise a protective film (not illustrated in the diagram) covering the tacky adhesive layer 2.

Figure 7:
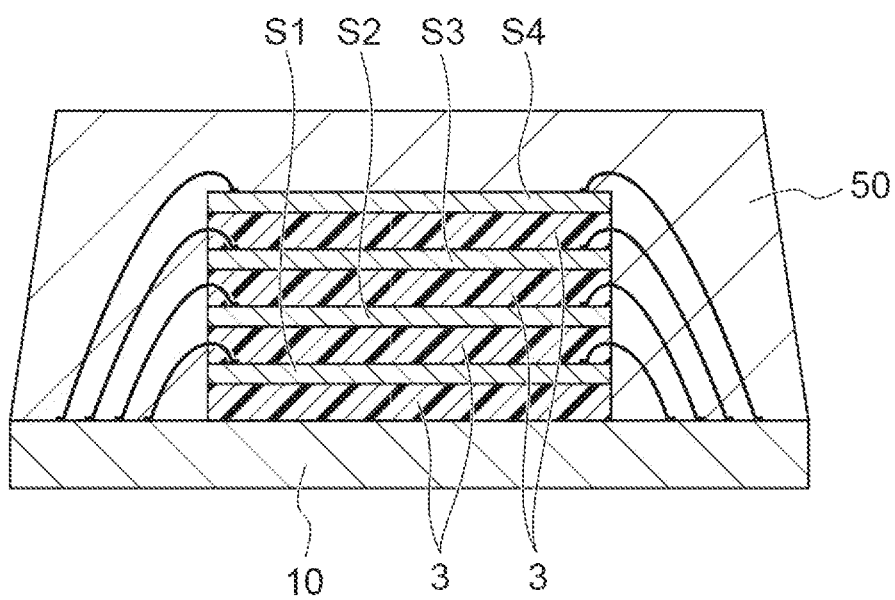
FIG. 7 is a cross-sectional view schematically illustrating another example of the semiconductor device.

Thus, embodiments of the present disclosure have been described in detail; however, the present invention is not intended to be limited to the above-described embodiments. For example, in the above-described embodiments, a package in which four semiconductor elements are laminated has been illustrated as an example; however, the number of semiconductor elements to be laminated is not limited to this. Furthermore, in the above-described embodiments, an embodiment in which a plurality of semiconductor elements are laminated by shifting the positions in a direction orthogonally intersecting the direction of lamination of the semiconductor elements has been illustrated as an example; however, as illustrated in FIG. 7, the semiconductor elements may be laminated without shifting the positions.

EXAMPLES

Hereinafter, the present disclosure will be more specifically described by way of Examples. However, the present invention is not intended to be limited to the following Examples.

Examples 1 to 12 and Comparative Examples 1 to 5

Varnishes (17 kinds in total) including the components shown in Tables 1 to 4 were prepared as follows. That is, cyclohexanone was added to a composition including an epoxy resin and a phenolic resin as heat-curable resins and a filler, and the mixture was stirred. An acrylic rubber as a high-molecular weight component was added to this, the mixture was stirred, and then a coupling agent and a curing accelerator were further added thereto. The mixture was stirred until the various components became sufficiently uniform, and thereby a varnish was obtained.

The components described in Tables 1 to 4 are as follows.

(Epoxy Resin)

YDCN-700-10: Cresol novolac type epoxy resin, manufactured by Nippon Steel & Sumikin Chemical Co., Ltd., epoxy equivalent 210, softening point 75° C. to 85° C.

EXA-830CRP (trade name): Bisphenol F type epoxy resin, manufactured by DIC Corp., epoxy equivalent 162, liquid at normal temperature YDF-8170C: Bisphenol F type epoxy resin, manufactured by Nippon Steel & Sumikin Chemical Co., Ltd., epoxy equivalent 159, liquid at normal temperature (Phenolic Resin)

MILEX XLC-LL ("MILEX" is a registered trademark): manufactured by Mitsui Chemicals, Inc., hydroxyl group equivalent 175, softening point 77° C.

PHENOLITE LF-4871 ("PHENOLITE" is a registered trademark): manufactured by DIC Corp., hydroxyl group equivalent 118, softening point 130° C.

(High-Molecular Weight Component)

HTR-860P: manufactured by Nagase ChemteX Corp., acrylic rubber, weight average molecular weight 800000, Tg −7° C.

(Filler)
SC-2050-HLG: manufactured by Admatechs Co., Ltd., silica filler dispersion liquid, average particle size 0.50 μm, largest particle size 1.0 μm or less
AEROSIL 8972 ("AEROSIL" is a registered trademark): manufactured by NIPPON AEROSIL CO., LTD., silica particles, average particle size 0.016 μm, largest particle size 1.0 μm or less (Coupling Agent)
A-189: γ-Mercaptopropyltrimethoxysilane, manufactured by Momentive Performance Materials Japan LLC
A-1160: γ-Ureidopropyltriethoxysilane, manufactured by Momentive Performance Materials Japan LLC (Curing Accelerator)
CUREZOL 2PZ-CN ("CUREZOL" is a registered trademark): 1-Cyanoethyl-2-phenylimidazole, manufactured by SHIKOKU CHEMICALS CORPORATION The varnish was filtered through a 500-mesh filter and degassed in a vacuum. The varnish after degassing in a vacuum was applied on a polyethylene terephthalate (PET) film (thickness 38 μm) that had been subjected to a mold release treatment. The applied varnish was heated and dried in two stages, that is, for 5 minutes at 90° C. and subsequently for 5 minutes at 140° C. In this way, an adhesive film comprising a film-shaped adhesive (thickness 7 μm) in the stage B state on a PET film as a base material film was obtained.

(Measurement of Melt Viscosity of Film-Shaped Adhesive)

The melt viscosity at 120° C. of the film-shaped adhesive was measured by the following method. That is, a plurality of layers of the film-shaped adhesive having a thickness of 7 μm were laminated to adjust the thickness to about 300 μm, and this was punched into a size of 10 mm×10 mm to obtain a sample for measurement. A circular aluminum plate jig having a diameter of 8 mm was mounted in a dynamic viscoelasticity apparatus, ARES (manufactured by TA Instruments, Inc.), and the above-described sample was mounted on this plate jig. Subsequently, measurement was made while raising the temperature to 130° C. at a rate of temperature increase of 5° C./min while applying 5% strain at 35° C., and the value of the melt viscosity at 120° C. was recorded. The results are presented in Tables 1 to 4.

(Measurement of Storage Modulus of Film-Shaped Adhesive)

The storage modulus at 35° C. of the film-shaped adhesive was measured using a dynamic viscoelasticity measuring apparatus (Rheogel E-4000) manufactured by UBM. That is, a plurality of layers of the film-shaped adhesive having a thickness of 7 μm were laminated to adjust the thickness to about 170 μm, and this was cut into a size of 4 mm in width×33 mm in length to obtain a sample for measurement. The sample was mounted in a dynamic viscoelasticity measuring apparatus (product name: Rheogel E-4000, manufactured by UBM), a tensile load was applied thereto, and measurement was made at a frequency of 10 Hz and a rate of temperature increase of 3° C./min. Thus, the storage modulus at 35° C. was measured. The results are presented in Tables 1 to 4.

[Evaluation of Divisibility of Film-Shaped Adhesive]

A dicing/die-bonding integrated film was produced by sticking each of the film-shaped adhesives (thickness 120 μm) according to Examples and Comparative Examples and a tacky adhesive film for dicing (manufactured by Maxell Holdings, Ltd.) together.

Modified regions were formed in a semiconductor wafer by irradiating the semiconductor wafer with a laser as described below, and then the divisibility of the film-shaped adhesive was evaluated by carrying out an expanding step under low temperature conditions. That is, a semiconductor wafer (silicon wafer, thickness 50 μm, outer diameter 12 inches) was prepared. A dicing/die-bonding integrated film was stuck to the semiconductor wafer such the film-shaped adhesive tightly adhered to one surface of the semiconductor wafer. The laminate including the semiconductor wafer (semiconductor wafer/film-shaped adhesive/tacky adhesive layer/base material layer) was subjected to stealth dicing using a laser dicing apparatus (manufactured by TOKYO SEIMITSU CO., LTD., MAHOH DICING MACHINE). The conditions were set as follows.

Laser light source: Semiconductor laser excitation Nd (YAG laser)
Wavelength: 1064 nm
Laser light spot cross-sectional area: $3.14 \times 10^{-8}$ cm$^2$
Oscillation form: Q switch pulse
Repeat frequency: 100 kHz
Pulse width: 30 ns
Output power: 20 μJ/pulse
Laser light quality: TEM00
Polarization characteristics: Linear polarization
Magnification ratio of light condensing lens: 50 times
NA: 0.55
Transmittance to laser light wavelength: 60%
Movement speed of the table on which the semiconductor wafer is placed: 100 mm/sec The laminate (semiconductor wafer/adhesive layer/tacky adhesive layer/base material layer) including the semiconductor wafer after the formation of modified regions was fixed to an expanding apparatus. Next, the film-shaped adhesive and the semiconductor wafer were split by expanding the dicing film (tacky adhesive layer/base material) under the following conditions. Thereby, an adhesive-attached semiconductor element was obtained.

Apparatus: DDS2300 (Fully Automatic Die Separator) manufactured by DISCO Corporation
Cool expanding conditions:
Temperature: −15° C., Height: 9 mm, Cooling time: 60 seconds
Speed: 300 mm/sec, Waiting time: 0 seconds The tacky adhesive layer after the expanding step was irradiated with ultraviolet radiation through the base material layer side for 3 seconds at an illuminance of 70 mW/cm$^2$. The pickup property of the adhesive-attached semiconductor elements was evaluated using a flexible die bonder DB-730 (trade name) manufactured by Renesas Electronics Corp. As a collet for pickup, RUBBER TIP 13-087E-33 (trade name, size: 5×5 mm) manufactured by Micro-Mechanics was used. As a thrust pin, EJECTOR NEEDLE SEN2-83-05 (trade name, diameter: 0.7 mm, tip shape: semicircle having a diameter of 350 μm) manufactured by Micro-Mechanics was used. Five thrust pins were disposed at a pin center spacing of 4.2 mm. The pickup conditions were set as follows.

Thrust speed of pins: 10 mm/second
Thrust height: 200 μm

After the stealth dicing step, the presence or absence of undivided adhesive-attached semiconductor elements was visually observed, and an evaluation was performed according to the following criteria. The results are presented in Tables 1 to 4.

A: There were no undivided adhesive-attached semiconductor elements.
B: There were one or more undivided adhesive-attached semiconductor elements.

[Presence or Absence of Detachment after Lamination of Four Stages]

A sample (adhesive-attached semiconductor element) in which the film-shaped adhesive had been suitably divided was used, and a structure having the same configuration as that of the structure illustrated in FIG. 5(a) was produced for Examples or Comparative Examples. After the semiconductor element of the fourth stage was laminated, whether detachment occurred between the first stage and the second stage was visually observed, and an evaluation was performed according to the following criteria. The results are presented in Tables 1 to 4.

A: Detachment did not occur in all samples.
B: There were one or more samples in which detachment had occurred.

[Evaluation of Reflow Resistance Characteristics]

Among the samples produced for the evaluation concerning the presence or absence of detachment, samples in which detachment did not occur were used to perform an evaluation of the reflow resistance characteristics by the following method. That is, a package for evaluation was obtained by sealing the semiconductor elements laminated in four stages with a mold sealing material (manufactured by Hitachi Chemical Co., Ltd., trade name "CEL-9750ZHF10"). Incidentally, the conditions for resin sealing were set to 175° C./6.7 MPa/90 seconds, and the curing conditions were set to 175° C. and 5 hours.

Twenty units of the above-described package were prepared, and these were caused to absorb moisture by exposing them to an environment defined by JEDEC (level 3, 30° C., 60 RH %, 192 hours). Subsequently, the packages after moisture absorption were passed through an IR reflow furnace (260° C., highest temperature 265° C.) three times. An evaluation was performed according to the following criteria. The results are presented in Tables 1 to 4.

A: Damage of the package, a change in thickness, detachment at the interface between the film-shaped adhesive and the semiconductor element, and the like were observed in not even one of the twenty packages.
B: Damage of the package, a change in thickness, detachment at the interface between the film-shaped adhesive and the semiconductor element, and the like were observed in at least one of the twenty packages.

TABLE 1

| | | | Example 1 | Example 2 | Example 3 | Example 4 | Example 5 |
|---|---|---|---|---|---|---|---|
| Resin component [parts by mass] | Epoxy resin | YDCN-700-10 | 10 | 10 | 10 | 20 | 5 |
| | | EXA-830CRP | — | — | — | — | — |
| | | YDF-8170C | — | — | — | — | — |
| | Phenolic resin | XLC-LL | — | — | — | — | 5 |
| | | LF-4871 | 10 | 10 | 10 | 10 | — |
| | High-molecular weight component | HTR-860P | 40 | 45 | 50 | 45 | 60 |
| | Filler [parts by mass] | SC-2050-HLG | 40 | 35 | 30 | 25 | 30 |
| | | R972 | — | — | — | — | — |
| | Coupling agent [parts by mass] | A-189 | — | — | — | — | 0.4 |
| | | A-1160 | — | — | — | — | 1 |
| | Curing accelerator [parts by mass] | 2PZ-CN | 0.2 | 0.15 | 0.1 | 0.1 | 0.01 |
| Content ratio of high-molecular weight component [mass %] (with respect to total mass of heat-curable resin composition) | | | 40 | 45 | 50 | 45 | 59 |
| Content ratio of filler [mass %] (with respect to total mass of heat-curable resin composition) | | | 40 | 35 | 30 | 25 | 30 |
| Melt viscosity at 120° C. [Pa · s] | | | 35000 | 31000 | 20000 | 14000 | 17000 |
| Storage modulus before curing at 35° C. [MPa] | | | 230 | 220 | 190 | 160 | 100 |
| Evaluation results | Divisibility of film-shaped adhesive | | A | A | A | A | A |
| | Presence absence of detachment after lamination of four stages | | A | A | A | A | A |
| | Reflow resistance | | A | A | A | A | A |

TABLE 2

| | | | Example 6 | Example 7 | Example 8 | Example 9 |
|---|---|---|---|---|---|---|
| Resin component [parts by mass] | Epoxy resin | YDCN-700-10 | 25 | 20 | 25 | 20 |
| | | EXA-830CRP | — | — | — | — |
| | | YDF-8170C | — | — | — | 5 |
| | Phenolic resin | XLC-LL | — | — | — | — |
| | | LF-4871 | 10 | 10 | 15 | 15 |
| | High-molecular weight component | HTR-860P | 40 | 35 | 30 | 30 |
| | Filler [parts by mass] | SC-2050-HLG | 25 | 35 | 30 | 30 |
| | | R972 | — | — | — | — |
| | Coupling agent [parts by mass] | A-189 | — | — | — | — |
| | | A-1160 | — | — | — | — |
| | Curing accelerator [parts by mass] | 2PZ-CN | 0.1 | 0.1 | 0.1 | 0.1 |
| Content ratio of high-molecular weight component [mass %] (with respect to total mass of heat-curable resin composition) | | | 40 | 35 | 30 | 30 |
| Content ratio of filler [mass %] (with respect to total mass of heat-curable resin composition) | | | 25 | 35 | 30 | 30 |
| Melt viscosity at 120° C. [Pa · s] | | | 9000 | 8000 | 6000 | 5000 |
| Storage modulus before curing at 35° C. [MPa] | | | 400 | 700 | 600 | 300 |
| Evaluation results | Divisibility of film-shaped adhesive | | A | A | A | A |
| | Presence absence of detachment after lamination of four stages | | A | A | A | A |
| | Reflow resistance | | A | A | A | A |

TABLE 3

|  |  |  | Example 10 | Example 11 | Example 12 |
|---|---|---|---|---|---|
| Resin component [parts by mass] | Epoxy resin | YDCN-700-10 | — | — | — |
|  |  | EXA-830CRP | — | — | — |
|  |  | YDF-8170C | — | — | — |
|  | Phenolic resin | XLC-LL | — | — | — |
|  |  | LF-4871 | 5 | 40 | 35 |
| High-molecular weight component | | HTR-860P | 50 | 30 | 40 |
| Filler [parts by mass] | | SC-2050-HLG | 45 | 30 | 25 |
|  |  | R972 | — | — | — |
| Coupling agent [parts by mass] | | A-189 | — | — | — |
|  |  | A-1160 | — | — | — |
| Curing accelerator [parts by mass] | | 2PZ-CN | 0.01 | 0.01 | 0.01 |
| Content ratio of high-molecular weight component [mass %] (with respect to total mass of heat-curable resin composition) | | | 50 | 30 | 40 |
| Content ratio of filler [mass %] (with respect to total mass of heat-curable resin composition) | | | 45 | 30 | 25 |
| Melt viscosity at 120° C. [Pa · s] | | | 40000 | 8000 | 10000 |
| Storage modulus before curing at 35° C. [MPa] | | | 600 | 450 | 260 |
| Evaluation results | Divisibility of film-shaped adhesive | | A | A | A |
|  | Presence absence of detachment after lamination of four stages | | A | A | A |
|  | Reflow resistance | | A | A | A |

TABLE 4

|  |  |  | Example 1 | Example 2 | Example 3 | Example 4 | Example 5 |
|---|---|---|---|---|---|---|---|
| Resin component [parts by mass] | Epoxy resin | YDCN-700-10 | 20 | 5 | 8 | 10 | 10 |
|  |  | EXA-830CRP | 10 | — | — | — | — |
|  |  | YDF-8170C | — | 15 | — | — | 15 |
|  | Phenolic resin | XLC-LL | 20 | — | 8 | 10 | — |
|  |  | LF-4871 | — | 15 | — | — | 15 |
| High-molecular weight component | | HTR-860P | 45 | 15 | 70 | 65 | 30 |
| Filler [parts by mass] | | SC-2050-HLG | — | 50 | 16 | — | 30 |
|  |  | R972 | 5 | — | — | 10 | — |
| Coupling agent [parts by mass] | | A-189 | 0.1 | 0.1 | 0.4 | 0.4 | — |
|  |  | A-1160 | 0.2 | 0.3 | 1 | 1 | — |
| Curing accelerator [parts by mass] | | 2PZ-CN | 0.1 | 0.1 | 0.01 | 0.01 | 0.1 |
| Content ratio of high-molecular weight component [mass %] (with respect to total mass of heat-curable resin composition) | | | 45 | 15 | 68 | 67 | 30 |
| Content ratio of filler [mass %] (with respect to total mass of heat-curable resin composition) | | | 5 | 50 | 15 | 10 | 30 |
| Melt viscosity at 120° C. [Pa · s] | | | 8000 | 5000 | 17000 | 26000 | 3000 |
| Storage modulus before curing at 35° C. [MPa] | | | 50 | 500 | 70 | 60 | 40 |
| Evaluation results | Divisibility of film-shaped adhesive | | A | B | B | B | A |
|  | Presence absence of detachment after lamination of four stages | | B | B | A | A | B |
|  | Reflow resistance | | A | A | A | A | A |

INDUSTRIAL APPLICABILITY

According to the present disclosure, there is provided a method for manufacturing a semiconductor device in which a plurality of semiconductor elements are laminated and in which detachment between adjacent semiconductor elements is not likely to occur. Furthermore, according to the present disclosure, a heat-curable resin composition and a dicing/die-bonding integrated film, which can be applied to the above-described manufacturing method, are provided.

REFERENCE SIGNS LIST

1: base material film, 2: tacky adhesive layer, 3: cured product of film-shaped adhesive, 3A: adhesive layer, 3P: film-shaped adhesive, 8: dicing/die-bonding integrated film, 20: adhesive-attached semiconductor element, 100: semiconductor device, W: semiconductor wafer.

The invention claimed is:

1. A method for manufacturing a semiconductor device, the method comprising:

a step of preparing a dicing/die-bonding integrated film including an adhesive layer formed of a heat-curable resin composition having a melt viscosity of 3100 Pa·s or higher at 120° C., a tacky adhesive layer, and a base material film in this order;

a step of sticking a surface on the adhesive layer side of the dicing/die-bonding integrated film and a semiconductor wafer together;

a step of dicing the semiconductor wafer;

a step of expanding the base material film and thereby dividing the semiconductor wafer and the adhesive layer into individual pieces, to obtain an adhesive-attached semiconductor element formed of the individual piece;

a step of picking up the adhesive-attached semiconductor element from the tacky adhesive layer;

a step of laminating the adhesive-attached semiconductor element to another semiconductor element, with an adhesive of the adhesive-attached semiconductor element interposed therebetween; and a step of heat-curing the adhesive.

2. The method for manufacturing a semiconductor device according to claim 1, wherein a storage modulus of the adhesive layer is 70 MPa or higher at 35° C.

3. The method for manufacturing a semiconductor device according to claim 1, wherein the semiconductor wafer is divided into individual pieces by either stealth dicing or blade dicing, and the base material film is expanded under cooling conditions.

4. The method for manufacturing a semiconductor device according to claim 1,
wherein the heat-curable resin composition contains a heat-curable resin, a high-molecular weight component having a molecular weight of 100000 to 1000000, and a filler, and
a content of the high-molecular weight component based on a total mass of the heat-curable resin composition is 15% to 66% by mass.

5. The method for manufacturing a semiconductor device according to claim 4, wherein a content of the filler based on a total mass of the heat-curable resin composition is 25% to 45% by mass.

6. The method for manufacturing a semiconductor device according to claim 1, wherein the method is a method for manufacturing a three-dimensional NAND memory.

7. A heat-curable resin composition used for a process for manufacturing a semiconductor device, having a melt viscosity of 3100 Pa·s or higher at 120° C., and having a storage modulus of 70 MPa or higher at 35° C.

8. The heat-curable resin composition according to claim 7, comprising a heat-curable resin, a high-molecular weight component having a molecular weight of 100000 to 1000000, and a filler,
wherein a content of the high-molecular weight component based on a total mass of the heat-curable resin composition is 15% to 66% by mass.

9. The heat-curable resin composition according to claim 8, wherein a content of the filler based on a total mass of the heat-curable resin composition is 25% to 45% by mass.

10. The heat-curable resin composition according to claim 7, wherein the heat-curable resin composition is used for a process for manufacturing a three-dimensional NAND memory.

11. A dicing/die-bonding integrated film, comprising:
a tacky adhesive layer; and
an adhesive layer formed of a heat-curable resin composition,
wherein the heat-curable resin composition is used for a process for manufacturing a semiconductor device and has a melt viscosity of 3100 Pa·s or higher at 120° C.

12. The dicing/die-bonding integrated film according to claim 11, wherein a thickness of the adhesive layer is 3 to 40 µm.

13. The dicing/die-bonding integrated film according to claim 11, wherein a storage modulus of the adhesive layer is 70 MPa or higher at 35° C.

14. The dicing/die-bonding integrated film according to claim 11, wherein the heat-curable resin composition contains a heat-curable resin, a high-molecular weight component having a molecular weight of 100000 to 1000000, and a filler.

15. The dicing/die-bonding integrated film according to claim 14, wherein a content of the high-molecular weight component based on a total mass of the heat-curable resin composition is 15% to 66% by mass.

16. The dicing/die-bonding integrated film according to claim 14, wherein a content of the filler based on a total mass of the heat-curable resin composition is 25% to 45% by mass.

* * * * *